(12) United States Patent
Reinmuth (10) Patent No.: US 9,513,476 B2
(45) Date of Patent: Dec. 6, 2016

(54) MICROELECTROMECHANICAL COMPONENT AND CORRESPONDING PRODUCTION METHOD

(71) Applicant: Robert Bosch GmbH, Stuttgart (DE)

(72) Inventor: Jochen Reinmuth, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 56 days.

(21) Appl. No.: 14/537,978

(22) Filed: Nov. 11, 2014

(65) Prior Publication Data

US 2015/0131135 A1    May 14, 2015

(30) Foreign Application Priority Data

Nov. 11, 2013  (DE) .................. 10 2013 222 836

(51) Int. Cl.
*G02B 26/08* (2006.01)
*B81B 3/00* (2006.01)
*H02N 1/00* (2006.01)

(52) U.S. Cl.
CPC ......... *G02B 26/0841* (2013.01); *B81B 3/0045* (2013.01); *H02N 1/008* (2013.01); *B81B 2201/042* (2013.01); *B81B 2203/04* (2013.01); *B81B 2203/058* (2013.01)

(58) Field of Classification Search
CPC ............... G02B 26/0841; B81B 2201/042; B81B 2203/058; B81B 2203/04; B81B 3/0045; H02N 1/008
USPC .............. 359/224.1–224.2, 221.2, 199.2, 200.6,359/900; 310/309; 438/26–27
See application file for complete search history.

(56) References Cited

U.S. PATENT DOCUMENTS 8,361,331 B2    1/2013  Yang et al.
2011/0056296 A1*  3/2011  Kanemoto ............ B81B 3/0086
73/514.32

* cited by examiner

*Primary Examiner* — James Phan
(74) *Attorney, Agent, or Firm* — Norton Rose Fulbright US LLP; Gerard Messina (57) ABSTRACT

A micro-electromechanical component includes: an electrically conductive substrate having an upper side and an underside; a structured electrically conductive first functional layer fashioned on the upper side of the substrate; an elastically deflectable actuator device suspended via a spring device fashioned in the first functional layer; a movable first electrode device extending vertically through the substrate and connected to the actuator device; and a stationary second electrode device extending vertically through the substrate, at a distance from the first electrode device, the actuator device being configured to be deflected through the application of an electrical voltage between the first and the second electrode device.

14 Claims, 12 Drawing Sheets

III

MICROELECTROMECHANICAL COMPONENT AND CORRESPONDING PRODUCTION METHOD

BACKGROUND OF THE INVENTION

1. Field of the Invention

The present invention relates to a micro-electromechanical component and to a corresponding production method.

2. Description of the Related Art

Microactuators, in particular micro-mirrors, are moved in most cases using either inductive or capacitive drives. In the case of capacitive drives, large electrode surfaces are desirable in order to produce large forces.

In contrast, however, a miniaturization of all components is advantageous in order to increase usability and to save costs.

In U.S. Pat. No. 8,361,331 B2, a micro-electromechanical mirror and a corresponding production method are described. Here, horizontal electrodes are situated on a CMOS chip, whereby the mirror is movable.

BRIEF SUMMARY OF THE INVENTION

The present invention provides a micro-electromechanical component having an electrically conductive substrate having an upper side and an underside; a structured electrically conductive first functional layer fashioned on the upper side of the substrate; an elastically deflectable actuator device that is suspended via a spring device fashioned in the first functional layer; a movable first electrode device that runs vertically through the substrate and is connected to the actuator device; and a stationary second electrode device that, at a distance from the first electrode device, runs vertically through the substrate, the actuator device being capable of being deflected through the application of an electrical voltage between the first and the second electrode device.

The production method according to the present invention includes: provision of an electrically conductive substrate having an upper side and an underside; formation of an electrically conductive first functional layer on the upper side of the substrate; structuring of the fashioned first functional layer in such a way that the first functional layer has a spring device and has an elastically deflectable actuator device that is suspended via the spring device; etching of the substrate, starting from the underside of the substrate, in such a way that there are fashioned, at a distance from one another, a movable first electrode device running vertically through the substrate, connected to the actuator device, and a stationary second electrode device running vertically through the substrate, whereby the actuator device is capable of being deflected through the application of an electrical voltage between the first and the second electrode device.

According to a preferred development, a structured electrically conductive second functional layer is fashioned on the underside of the substrate. On the second functional layer, contact surfaces are fashioned via which an electrical voltage can be applied between the first and the second electrode device. Thus, for example a drive ASIC can be attached directly onto the component.

According to a further preferred development, the second functional layer is connected mechanically and/or electrically to a bearer substrate via the contact surfaces.

According to a further preferred development, an electrical potential can be applied to the first electrode device via the spring device. According to a further preferred development, via a third electrode device that runs vertically through the substrate an electrical potential can be applied via the first functional layer to the first electrode device from the underside of the substrate. This can provide particularly simple and versatile contacting possibilities.

According to a further preferred development, the movable first electrode device is fashioned as a cylinder. This shape is easy to realize through etching. The electrode device can also be fashioned as a hollow cylinder, which reduces its weight, which can be advantageous for applications having a high frequency of movement.

According to a further preferred development, the stationary second electrode device is fashioned as at least four individual electrodes situated at a distance from one another in polygonal symmetry, in particular rectangular symmetry, situated around the first electrode device. In this way, arbitrary movements of the actuator device are enabled, and the corresponding control directions can easily be calculated.

According to a further preferred development, the actuator device is connected to a mirror element that has a reflective surface pointing away from the upper side of the substrate. In this way, the component can be fashioned as a micro-mirror that can be used in a versatile manner.

According to a further preferred development, the mirror element is connected to the actuator device via a spacer device. In this way, the freedom of movement of the actuator device can be increased.

According to a further preferred development, a configuration is provided of micro-electromechanical components according to the present invention, in which a plurality of the components is mechanically and/or electrically connected through bonding to a common bearer substrate.

According to a preferred development, the production method according to the present invention includes a deposition and structuring of a first dielectric layer on the underside of the substrate, the etching of the substrate taking place through a grid fashioned in the structured first dielectric layer and/or through open regions in the structured first dielectric layer.

According to a further preferred development, the production method includes a deposition of a first start layer, in particular made of polysilicon, in particular using a low-pressure gas phase deposition process, on the upper side of the substrate, the formation of the first functional layer taking place using an epitaxial deposition on the first start layer.

According to a further preferred development, the production method includes a bonding of a structured wafer, in particular of a silicon-on-insulator wafer, onto the first functional layer, in particular via germanium contact surfaces fashioned on the structured layer. It further includes an exposure of an internal surface of the bonded-on structured wafer, as well as a deposition of a reflective mirrored layer on the exposed surface of the bonded-on structured wafer, thus fashioning a mirror element. The bonding on of the wafer can lend stability to the component being produced for the following method steps.

The present invention discloses a method for the particularly simple and low-cost production of a micro-electromechanical component having a movable actuator device that can be driven or detected via vertical electrode devices. The dimensions of the actuator device to be driven are independent of the dimensions of the electrode devices required for this. Thus, relatively small spacings can be fashioned between electrode devices, and/or relatively large actuator devices can be fashioned.

BRIEF DESCRIPTION OF THE DRAWINGS

FIG. 2b shows a schematic upright cross-sectional view through component 100' being produced, along the line A-A' in FIG. 2a.

FIG. 3 shows a schematic upright cross-sectional view through component 100' being produced, corresponding to the line A-A' in FIG. 2a.

FIG. 4b shows a schematic reversed cross-sectional view through component 100' being produced, along the line B-B' in FIG. 4a.

FIG. 5b shows a schematic reversed cross-sectional view through component 100' being produced, along the line C-C' in FIG. 5a.

FIG. 6 shows a schematic reversed cross-sectional view through component 100' being produced, corresponding to the line C-C' in FIG. 5a.

FIG. 7b shows a schematic upright cross-section-type side view through component 100 being produced, along the line E-E' in FIG. 7a.

FIG. 8 shows a schematic reversed cross-section-type side view through component 100' being produced, corresponding to the line E-E' in FIG. 7a.

FIG. 9b shows a schematic upright cross-section-type side view through component 100' being produced, along the line F-F' in FIG. 9a.

FIG. 10b shows a schematic upright cross-section-type side view through component 100' being produced, along the line G-G' in FIG. 10a.

FIG. 12b shows a schematic upright cross-section-type side view through the component being produced, according to the fifth specific embodiment, along the line H-H' in FIG. 12a.

DETAILED DESCRIPTION OF THE INVENTION

In the Figures, identical reference characters designate identical or functionally identical elements unless otherwise indicated.

Figure 1:
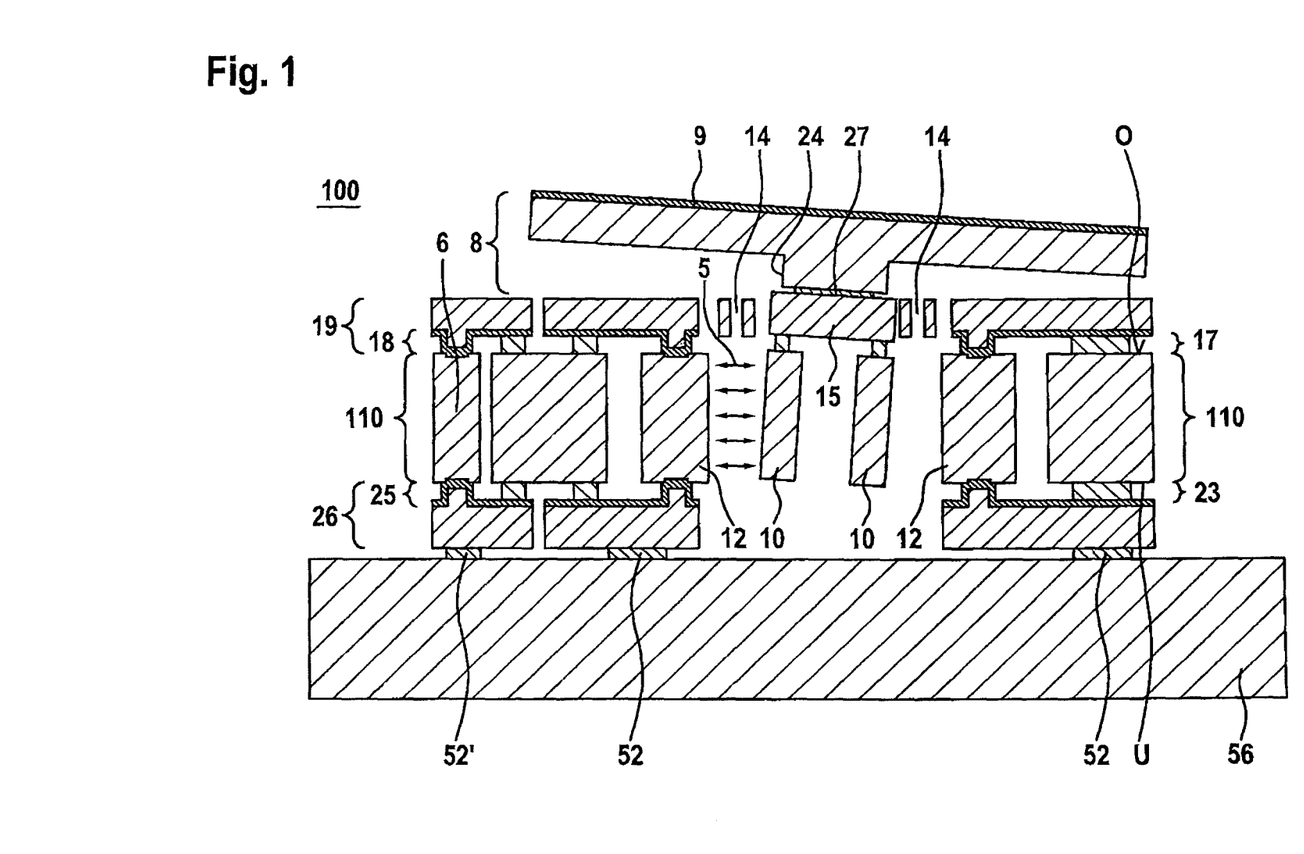
FIG. 1 shows a schematic cross-section-type side view illustrating a micro-electromechanical component 100 according to a first specific embodiment of the present invention.

FIG. 1 shows a schematic cross-sectional side view illustrating a micro-electromechanical component 100 according to a first specific embodiment of the present invention.

In an electrically conductive substrate 110 there is fashioned a first movable electrode device 10 that runs vertically through substrate 110. Substrate 110 can in particular be a doped monocrystalline silicon substrate.

In FIG. 1, first electrode device 10 is fashioned as a hollow cylinder. However, it can also be fashioned as a solid cylinder, or can have other shapes, such as a cuboid shape.

At a distance from first electrode device 10, a stationary second electrode device 12 runs vertically through substrate 110. A structured electrically conductive first functional layer 19 is fashioned on an upper side O of substrate 110. First functional layer 19 is advantageously a polysilicon or poly-SiGe layer. An elastically deflectable actuator device 15 is suspended via a spring device 14 fashioned in first functional layer 19, and is connected to movable first electrode device 10. Actuator device 15 is capable of being deflected through the application of an electrical voltage 5 between first and second electrode device 10, 12. For better comprehension, spring device 14 is shown in FIG. 1, although it is actually not situated in the cross-sectional surface otherwise shown in FIG. 1. This is described in more detail below with reference to FIG. 7a.

As a result of the production, a first structured start layer 18, in particular made of polysilicon, can be fashioned on the side of first functional layer 19 facing upper side O of substrate 110, as shown in FIG. 1. Via first start layer 18, there exists an electrical contact between parts of first functional layer 19 and first or second electrode device 10, 12. In specific embodiments in which no first start layer 18 is fashioned, a mechanical and/or electrical connection can take place directly between parts of first functional layer 19 and first or second electrode device 10, 12. At locations where no electrical contact is to be produced between first functional layer 19 and parts of substrate 110, a structured first dielectric layer 17, in particular an oxide layer, in particular $SiO_2$, is fashioned between substrate 110 and first functional layer 19.

A structured electrically conductive second functional layer 26 is fashioned on an underside U of substrate 110. Second functional layer 26 can in particular be fashioned as a polysilicon or poly-SiGe layer. However, second functional layer 26 can also be fashioned as a metallic layer, such as an aluminum layer. As a result of production conditions, a second start layer 25, in particular a polysilicon start layer, can be fashioned on second functional layer 26, on its side facing underside U of substrate 110. For the stable suspension of the electrode devices, layer thicknesses of first and second functional layer 19, 26 in a range of from 1 to 5 μm or more are favorable.

Second functional layer 26 is mechanically and electrically connected to parts of substrate 110, in particular to second electrode device 12, via second start layer 25. In specific embodiments in which no second start layer 25 is fashioned, a mechanical and/or electrical connection can take place directly between parts of second functional layer 26 and of first or second electrode device 10, 12. Second functional layer 26 is situated at a distance from other regions of substrate 110 through a structured second dielectric layer 23, in particular an oxide layer, in particular an $SiO_2$ layer.

On the side of second functional layer 26 oriented away from underside U of substrate 110, contact surfaces 52 are fashioned via which an electrical potential can be applied to second electrode device 12 via parts of second functional layer 26 and second start layer 25.

At a distance from first and second electrode device 10, 12, a third electrode device 6 runs vertically through substrate 110. Third electrode device 6 is connected at a first side to first functional layer 19 via first start layer 18, and is connected at an oppositely situated side to second functional layer 26 via second start layer 25, mechanically and electrically in each case. The segment of second functional layer 26 connected to third electrode device 6 is situated at a distance from the segment of second functional layer 26 connected to second electrode device 12.

A contact surface 52' is attached on the segment of second functional layer 26 connected to third electrode device 6, on the side of second functional layer 26 oriented away from underside U of substrate 110. An electrical potential can be applied to first electrode device 10 via contact surface 52', the segment of second functional layer 26 connected thereto, the segment of second start layer 25 connected thereto, third electrode device 6, the segment of first start layer 18 connected thereto, the segment of first functional layer 19 connected thereto, and spring device 14 and actuator device 15. The electrical connection between spring device 14 and the segment of first functional layer 19 connected to third electrode device 6 is not shown in FIG. 1, but is explained below with reference to FIG. 9a. Thus, through application of a voltage between contact surface 52' and one or more of contact surfaces 52, a voltage 5 can be applied between first electrode device 10 and second electrode device 12, through which actuator device 15 can be deflected, as shown in FIG. 1.

According to a further specific embodiment (not shown), a component can also be provided not having a third electrode device 6, in which an electrical contacting of first electrode device 10 takes place via upper side O of substrate 110.

On a surface of the actuator device oriented away from upper surface O of substrate 110, there is fashioned a structured connecting layer 27, in particular an aluminum layer. A mirror element 8 is fixedly connected to actuator device 15 via connecting layer 27. Thus, mirror element 8 can also be deflected through deflection of actuator device 15. Mirror element 8 has a reflective surface 9, in particular based on a mirror metallization, on a surface oriented away from surface O of substrate 110.

According to the first specific embodiment, mirror element 8 is fashioned in such a way that reflective surface 9 is larger than the surface of actuator device 15 to which mirror element 8 is connected. Mirror element 8 can for example be structured out from a silicon wafer, as is explained below with reference to FIGS. 10 through 14. At the point of connection between mirror element 8 and connecting layer 27, there can be fashioned a contact, in particular a germanium contact. At the point of connection between mirror element 8 and connecting layer 27 and/or the germanium contact, a projecting region 24 of mirror element 8 can be fashioned. Projecting region 24 and/or connecting layer 27 and/or the germanium contact form a spacer device 24, 27.

According to a further specific embodiment (not shown), the mirror element can also be fashioned as a reflective surface 9 attached directly on actuator device 15, in particular based on a mirror metallization.

FIGS. 2a through 10b show intermediate steps of a method according to the present invention for producing a micromechanical component 100' according to a second specific embodiment of the present invention, essentially representing a modification of the first specific embodiment. Here, plan views from above, i.e. in the direction of upper side O of substrate 110, are designated "I," and plan views from below, i.e. in the direction of underside U of substrate 110, are designated "II." Cross-sectional views, or cross-section-type views, depicting upper side O of substrate 110 at top, are designated "upright" and identified with "III," and views in which underside U of substrate 110 is depicted at top are designated "reverse" and designated with IV. For clarity, reference characters known from earlier Figures are omitted from later Figures, as long as the corresponding structures are clearly recognizable.

Figure 2A:
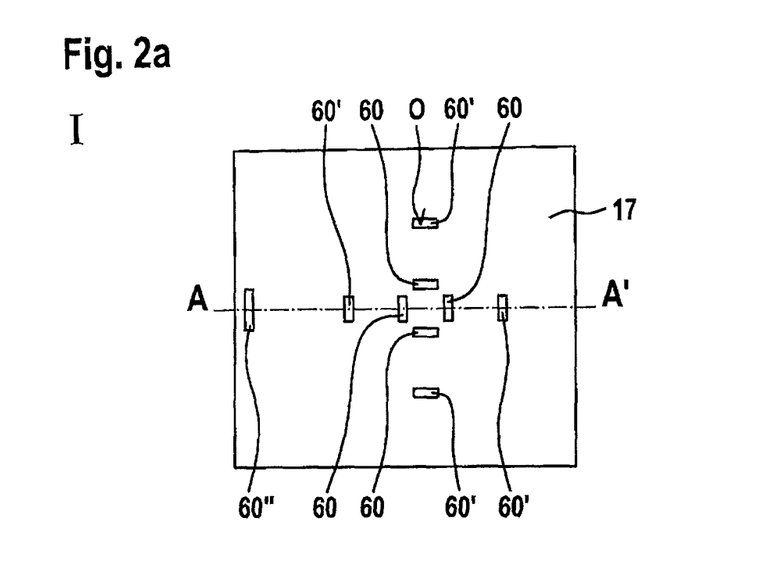
FIG. 2a shows a schematic plan view from above of a component 100' being produced, according to a second specific embodiment of the present invention.

FIG. 2a shows a schematic plan view from above of component 100' being produced.

Figure 2B:
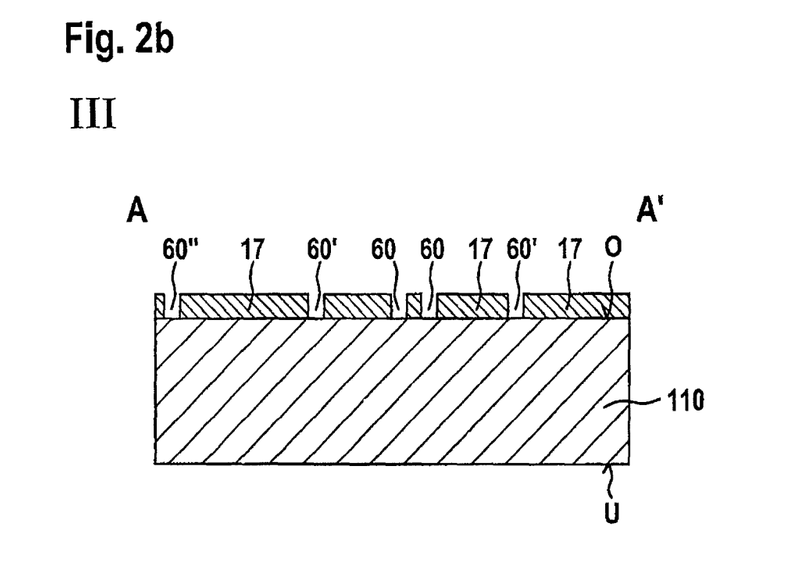

FIG. 2b shows a schematic upright cross-sectional view through component 100' being produced, along line A-A' in FIG. 2a.

In a first method step of the production method of the present invention, according to FIGS. 2a and 2b a conductive substrate 110, preferably a doped monocrystalline silicon substrate, is provided. On front side O of substrate 110 first dielectric layer 17, preferably an $SiO_2$ layer, in particular a TEOS (tetraethyl orthosilicate) layer having low intrinsic layer stress, is deposited and structured; see FIGS. 2a (plan view from above) and 2b (side view). In this step, a dielectric auxiliary layer 20 can also be additionally deposited and/or structured on underside U of substrate 110.

In the structuring of first dielectric layer 17, rectangular openings 60, 60', 60" are fashioned that vertically completely traverse first dielectric layer 17, whereby regions of surface O of substrate 110 are opened. Four openings 60 are fashioned that are configured in rectangular symmetry, and four further openings 60' are configured in rectangular symmetry around the four openings 60, each two openings 60 and two openings 60' being aligned with one another. Two openings 60 and two openings 60' additionally align with an opening 60" that is situated close to the edge of substrate 110.

Figure 3:
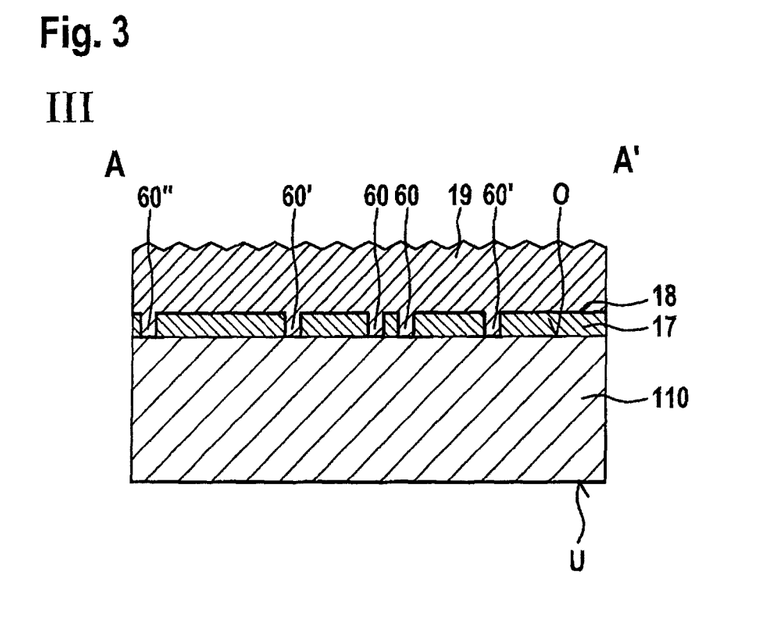

FIG. 3 shows a schematic upright cross-sectional view through component 100' being produced, corresponding to line A-A' in FIG. 2a.

According to FIG. 3, in a further method step a polycrystalline silicon layer (polysilicon layer) and/or a polycrystalline silicon/germanium poly layer (poly-Si-Ge layer) is deposited, as first functional layer 19, on upper side O of substrate 110.

Particularly advantageous is the preceding deposition of a thin first start layer 18, using a low-pressure gas phase deposition process (LPCVD, or low-pressure chemical vapor deposition). Subsequently, polycrystalline first functional layer 19 can be deposited epitaxially (as so-called epi-poly-layer) onto first start layer 18; see FIG. 3. First functional layer 19 is doped, or is deposited in doped fashion. First functional layer 19 is connected, via first start layer 18 if warranted, to surface O of substrate 110 through openings 60, 60', 60" in first dielectric layer 17.

Depending on the thickness of substrate 110, substrate 110 can now be thinned, from its underside U, to a specified target thickness.

Figure 4A:
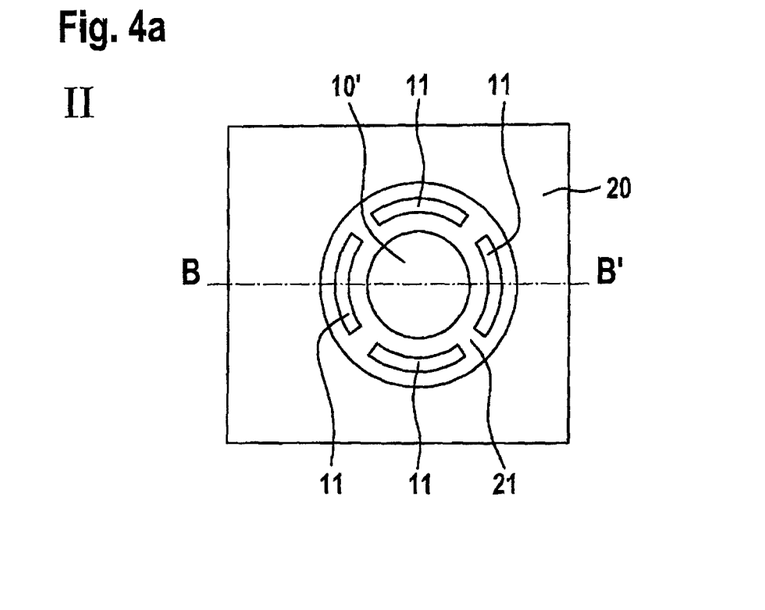
FIG. 4a shows a schematic plan view from below of component 100' being produced.

FIG. 4a shows a schematic plan view from below of component 100' being produced.

Figure 4B:
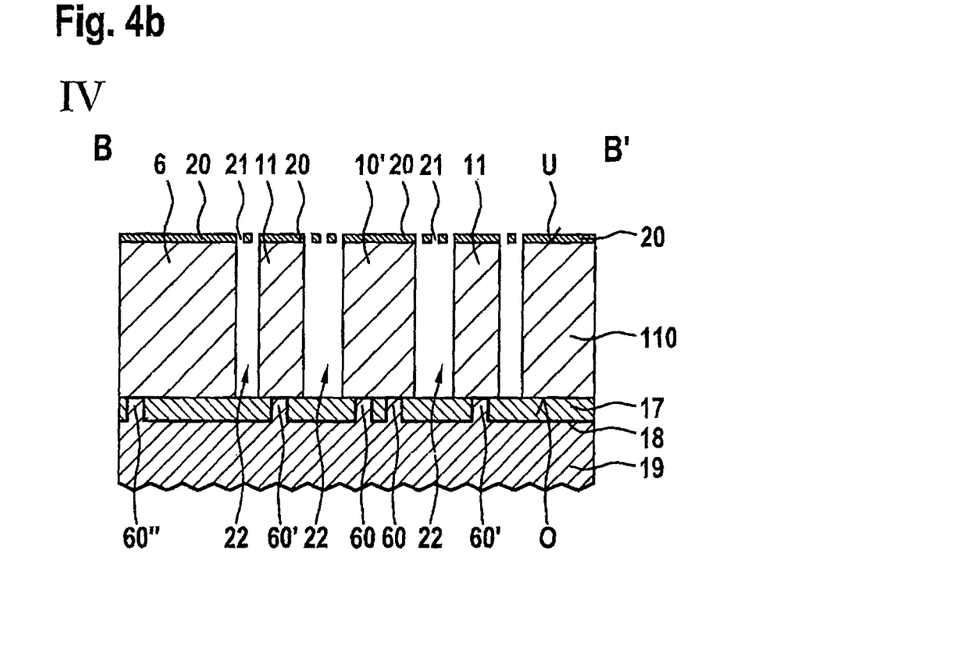

FIG. 4b shows a schematic reverse cross-sectional view through component 100' being produced, along the line B-B' in FIG. 4a.

According to FIGS. 4a and 4b, in a further method step a thin dielectric auxiliary layer 20, preferably an oxide layer, preferably an $SiO_2$ layer, in particular a TEOS layer having low intrinsic layer stress, is deposited and structured on underside U of substrate 110. Over regions 22, which are to be etched for the structuring out of electrode devices 6, 10', 12 from substrate 110, either auxiliary layer 20 is opened, or, in the case of broad structures, a grid 21 is fashioned over regions 22.

For example using a method as disclosed in DE 10 2009 045 385 A1, through openings or grid 21 substrate 110 situated thereunder is etched anisotropically, so that chambers 22 are fashioned in substrate 110 (see FIGS. 4a and 4b). Through the etching of chambers 22, first electrode device 10', fashioned as a solid cylinder according to the second specific embodiment, and four individual electrodes 11 of second electrode device 12, situated at a distance from one another and configured in rectangular symmetry around first electrode device 10', are fashioned as cylinder chamber segments and are situated at a distance from the rest of substrate 110. The rest of substrate 110 has third electrode device 6.

Here, the connection between first functional layer 19 and substrate 110 through openings 60 in first dielectric layer 17 is situated over first electrode device 10'. The connections between first functional layer 19 and substrate 110 through openings 60' in first dielectric layer 17 are each situated over an individual electrode 11 of second electrode device 12. The connection between first functional layer 19 and substrate 110 through opening 60" in first dielectric layer 17 is situated over third electrode device 6.

Figure 5A:
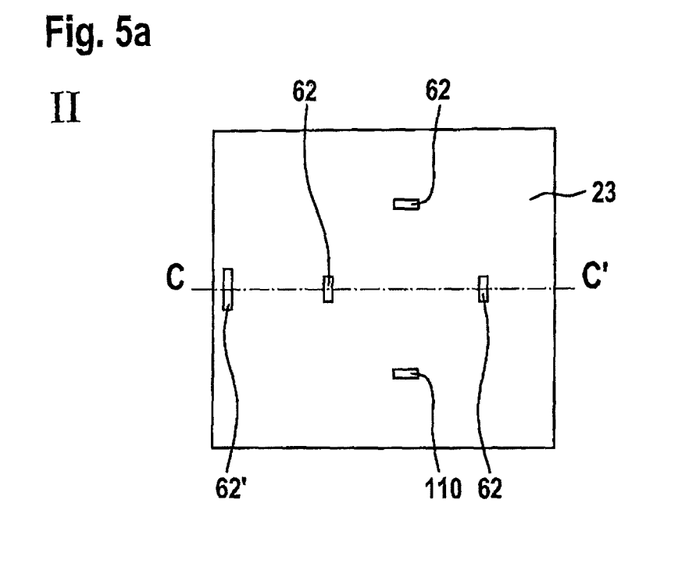
FIG. 5a shows a schematic plan view from below of component 100' being produced.

FIG. 5a shows a schematic plan view from below of component 100' being produced.

Figure 5B:
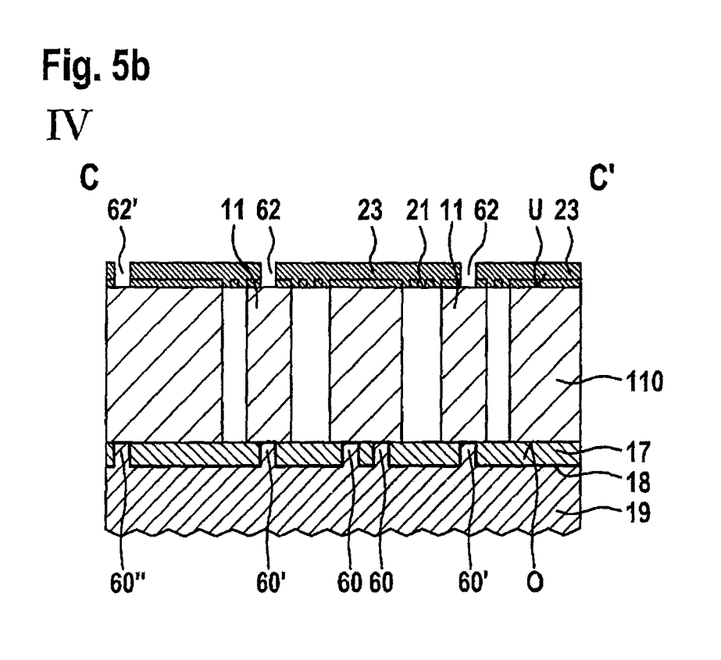

FIG. 5b shows a schematic reversed cross-sectional view through component 100' being produced, along the line C-C' in FIG. 5a.

According to FIGS. 5a and 5b, in a further method step a second dielectric layer 23 is deposited on underside U of substrate 110 (alternatively also on both sides), preferably an oxide layer 23, preferably an SiO$_2$ layer, in particular a TEOS layer having low intrinsic layer stress, and grid 21 is sealed thereby. Oxide layer 23 is subsequently structured together with auxiliary layer 20.

The structure can be recognized in the plan view shown in FIG. 5a. Here, openings 62, 62' are formed that extend vertically through oxide layer 23 and auxiliary layer 20, so that regions of underside U of substrate 110 are opened. The four openings 62 are fashioned with a rectangular shape for electrical contact regions under each of the individual electrodes 11 of second electrode device 12 or under other parts of substrate 110. Opening 62' is fashioned with a rectangular shape over third electrode device 6. The region of oxide layer 23 connected to first electrode device 10' can be etched away later, so that actuator device 15 is not hindered during a movement.

Figure 6:
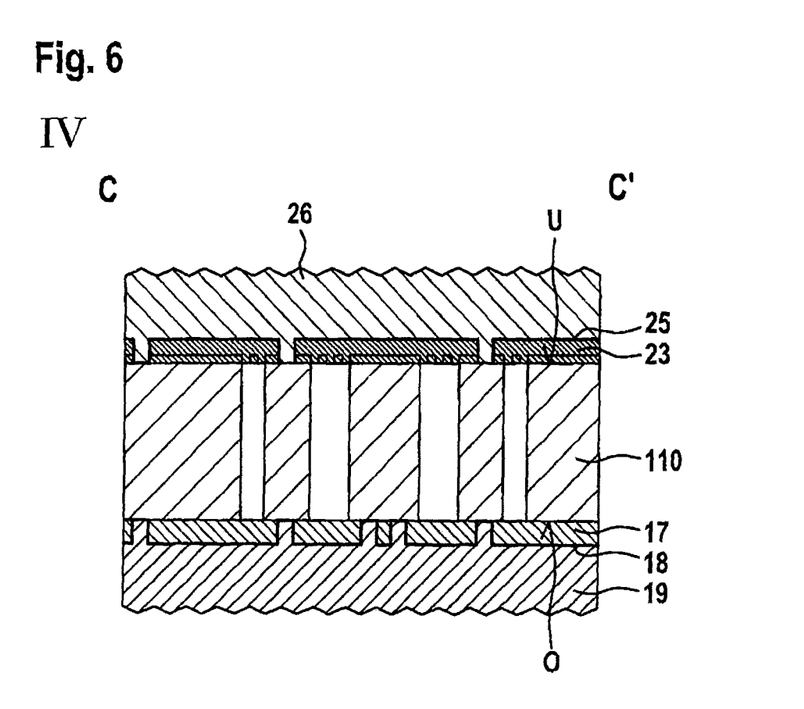

FIG. 6 shows a schematic reversed cross-sectional view through component 100' being produced, corresponding to the line C-C' in FIG. 5a.

According to FIG. 6, a polycrystalline silicon layer (polysilicon layer) and/or a polycrystalline silicon/germanium poly layer (poly-Si—Ge layer) is deposited on underside U of substrate 110 as second functional layer 26.

Particularly advantageously, the preceding deposition of a thin second start layer 15 is accomplished using a low-pressure gas phase deposition process. Subsequently, polycrystalline second functional layer 26 is deposited epitaxially (as so-called epi-poly-layer) on second start layer 25; see FIG. 6. Second functional layer 26 is doped or is deposited in doped fashion.

Figure 7A:
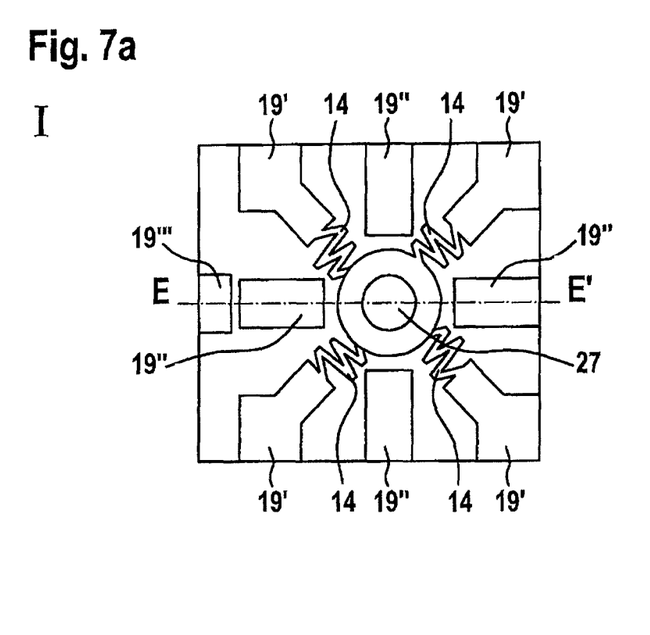
FIG. 7a shows a schematic plan view from above of component 100' being produced.

FIG. 7a shows a schematic plan view from above of component 100' being produced.

Figure 7B:
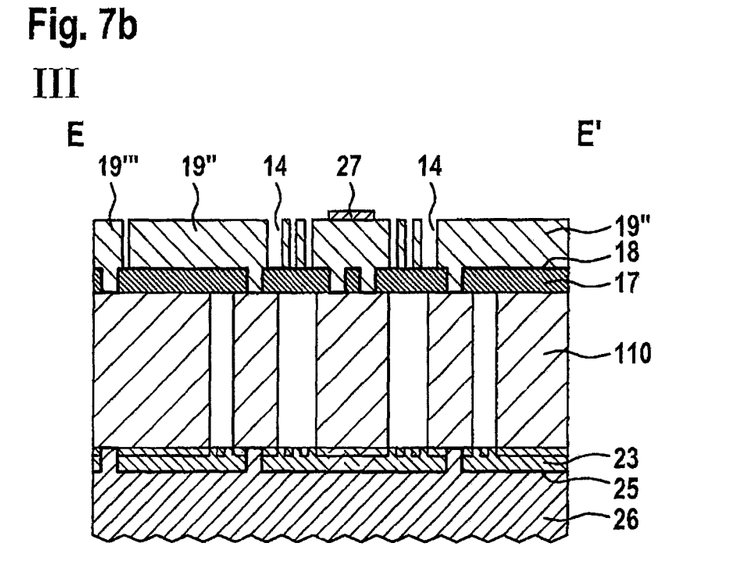

FIG. 7b shows a schematic upright cross-section-type side view through component 100' being produced, along the line E-E' in FIG. 7a. For better understanding, spring device 14 is depicted here and in the following cross-section-type views even though it is actually not situated on the line E-E', as can be seen in FIG. 7a.

According to FIGS. 7a and 7b, in a further method step the raw surface of first functional layer 19, fashioned as an epi-poly layer, is planarized on its upper side, i.e. the side facing away from substrate 110, for example through chemical-mechanical polishing (CMP). Scratches and defects that may arise on the front side during the processing of the rear side can be removed in this way. At the same time, a relatively smooth surface is produced, which is necessary for the following processes.

According to a further specific embodiment (not shown), mirror metallization 9 can be applied directly onto the smooth surface of first functional layer 19, and can be structured if necessary.

In a further method step, a material for applying mirror structures 8 on actuator device 15 is applied and structured. In particular, it is advantageous to apply and to structure connecting layer 27 made of aluminum onto the smooth surface of first functional layer 19. According to the second specific embodiment, connecting layer 27 is fashioned as a circular aluminum disk, i.e. as a flat cylinder, whose midaxis coincides with the mid-axis of first electrode device 12, fashioned as a cylinder, or hollow cylinder. The radius of the aluminum disk of connecting layer 27 is smaller than the outer radius of first electrode device 10'.

First functional layer 19, fashioned as an epi-poly layer, is structured over its entire height, using a trench process, in such a way that spring device 14 is fashioned, as is shown in FIG. 7a. After the trench process, actuator device 15 is then connected, within first functional layer 19, to four non-etched regions 19' of first functional layer 19 only via narrow, zigzag-shaped segments 14 of first functional layer 19, so that the narrow, zigzag-shaped segments 14 form a spring device 14 after the removal of first dielectric layer 17 situated under them. In addition, during the etching five regions 19", 19''' are fashioned that are each connected with no other region of first functional layer 19 within first functional layer 19. The four regions 19" are configured in rectangular symmetry around first actuator device 15, and each have a connection, via first start layer 18, through openings 60' fashioned in first dielectric layer 17, to a respective individual electrode 11 of second electrode device 12. Region 19''' has a connection to third electrode device 6 via first start layer 18 and opening 60" fashioned in first dielectric layer 17.

Figure 8:
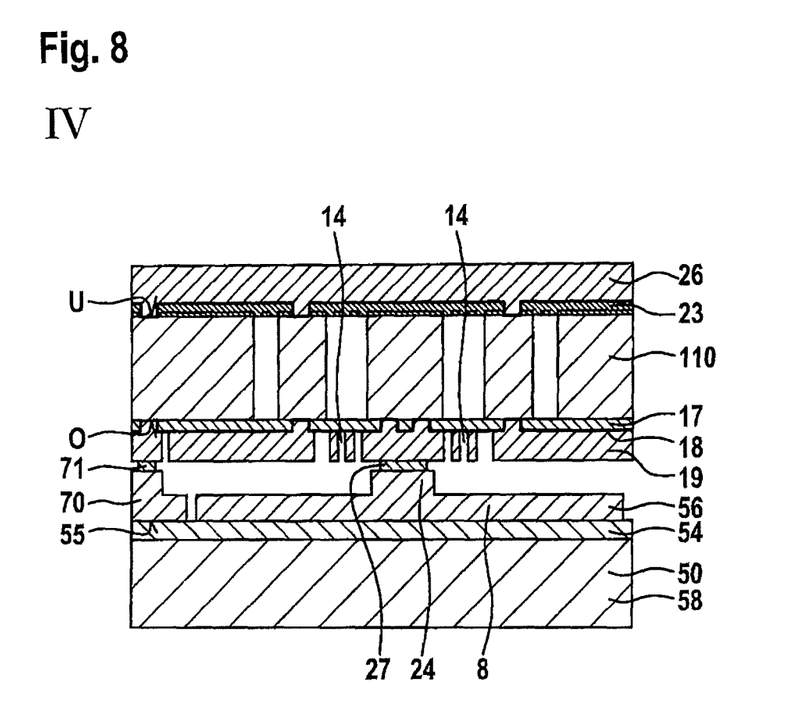

FIG. 8 shows a schematic reversed cross-section-type side view through component 100' being produced, corresponding to the line E-E' in FIG. 7a.

According to FIG. 8, in a further method step, for the formation of mirror element 8 a structured wafer 50 having a sacrificial oxide layer 54 is eutectically bonded onto connecting layer 27. Advantageous is a SOI (silicon on insulator) wafer 50 that is preferably bonded on a protruding region 24 of wafer 50, on which a contact, in particular a germanium contact, is advantageously fashioned. Structured wafer 50 can have a first segment 58, in particular made of silicon, that is situated at a distance, through a sacrificial oxide layer 54, from a second segment 56 that has in particular silicon. Second segment 56 has the projecting region 24 and is suitable for the formation of mirror elements 8 or for bonding onto connecting layer 27. The boundary surface between second segment 56 and sacrificial oxide layer 54 is an internal surface 55 of wafer 50.

If the structures on upper side O of substrate 110 are protected by the SOI wafer, then according to FIG. 8 the raw surface of second functional layer 26, fashioned as epi-poly layer, on the rear side of functional layer 26, i.e. over underside U of substrate 110 on the side of second functional layer 26 facing away from the substrate, can be planarized using CMP. Scratches and defects that may arise on the rear side during the processing of the front side, i.e. over upper side O of substrate 110, can be removed in this way. At the same time, a relatively smooth surface is produced that can be necessary for the subsequent processes.

On one, several, or all edges of component 100', an edge element 70 can be provided that for example is bonded onto first functional layer 19 via a connecting layer 71. Connecting layer 71 can for example be fashioned simultaneously with connecting layer 27. Edge element 70 can be fashioned and bonded on analogously to mirror elements 8, and simultaneously in the corresponding method steps, and can act to stabilize component 100' and to protect it against laterally acting disturbing influences.

Figure 9A:
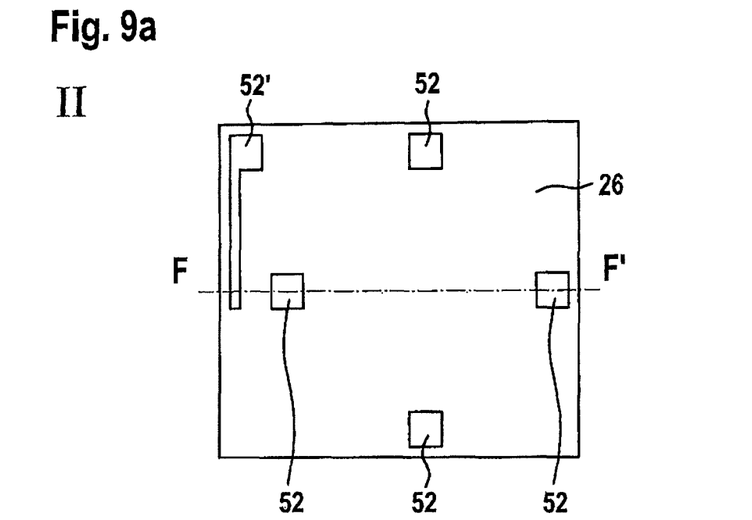
FIG. 9a shows a schematic plan view from below of component 100' being produced.

FIG. 9a shows a schematic plan view from below of component 100' being produced.

Figure 9B:
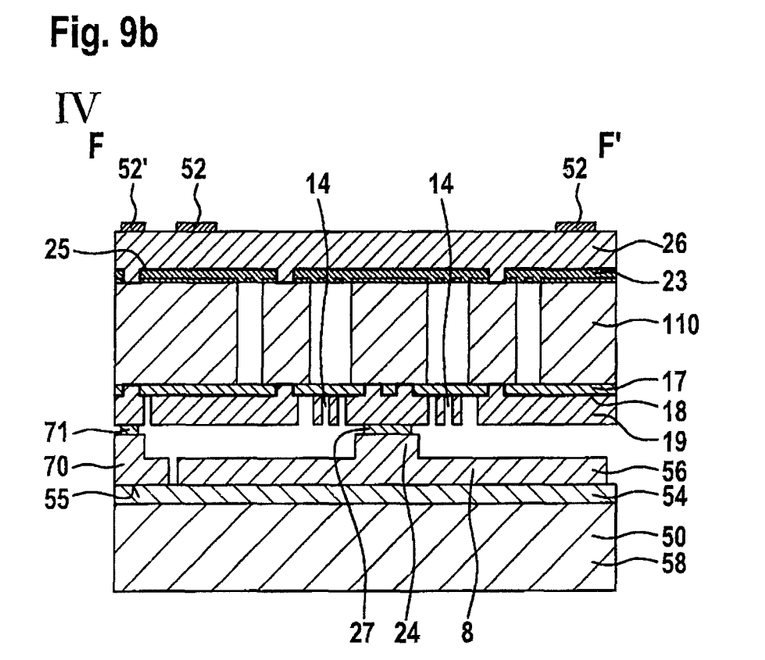

FIG. 9b shows a schematic reversed cross-section-type side view through component 100' being produced, along the line F-F' in FIG. 9a.

According to FIGS. 9a and 9b, in a further method step contact surfaces 52, 52' are deposited and structured on the rear side of second functional layer 26. Advantageous are solderable metal layers such as nickel, copper, silver, or gold, that permit for example a so-called flip-chip process with which for example a drive ASIC can then be applied directly onto the micromechanical component 100' in the further process sequence. Four quadratic contact surfaces 52 are situated around actuator device 15 in rectangular symmetry. Contact surface 52' has an arm going out from a quadratic base surface that is fashioned close to a corner of substrate 110, the arm extending close to an edge of substrate 110 and past the corresponding edge center in such a way that a segment of contact surface 52' comes to be situated over opening 62'.

Figure 10A:
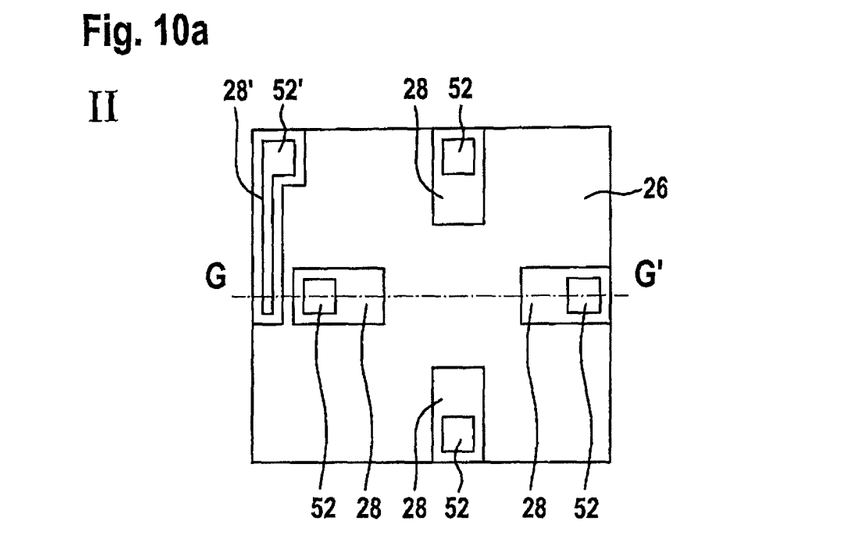
FIG. 10a shows a schematic plan view from below of component 100' being produced.

FIG. 10a shows a schematic plan view from below of component 100' being produced.

Figure 10B:
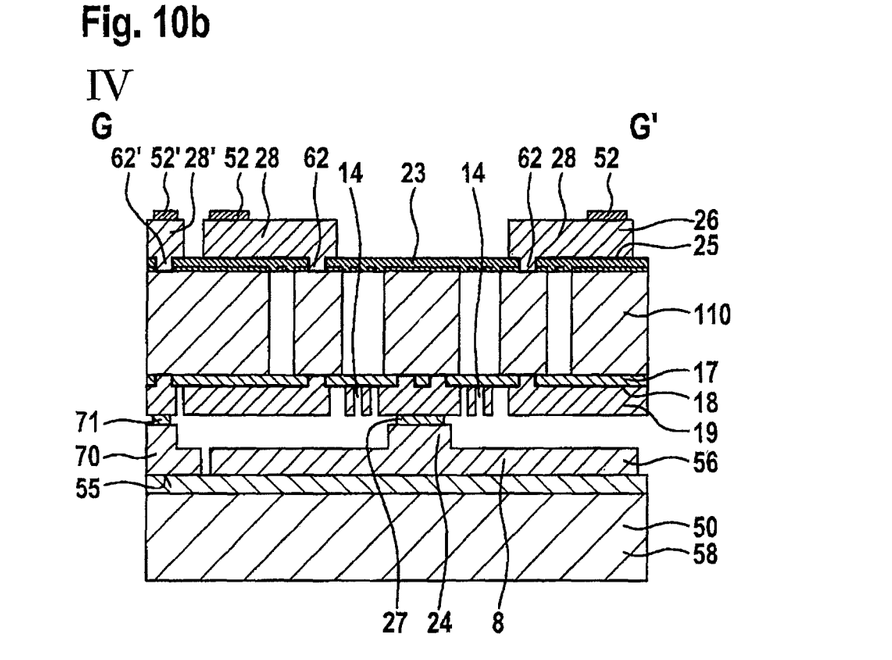

FIG. 10b shows a schematic reversed cross-section-type side view through component 100' being produced, along the line G-G' in FIG. 10a.

According to FIGS. 10a and 10b, in a further method step second functional layer 26, fashioned as an epi-poly layer, and second start layer 25 are structured from their rear side, i.e. from the side facing away from substrate 110, using a trench process. Polygonal regions 28, 28' spaced horizontally from one another by trenches, in particular rectangular regions 28, of second functional layer 26 and of second start layer 25 are fashioned. Regions 28 are fashioned around contact surfaces 52 and regions 28' are fashioned around contact surfaces 52', and are mechanically and electrically connected to the respective contact surfaces 52, 52'.

Contact surfaces 52 and regions 28 of second functional layer 26 are configured and fashioned in polygonal symmetry, in particular rectangular symmetry, around first electrode device 12 and/or around actuator device 15 in such a way that via contact surfaces 52 and regions 28 an electrical potential can be applied to second electrode devices 12 via openings 62, through first dielectric layer 17.

Contact surface 52' is fashioned in such a way that via it, and regions 28' of second functional layer 26 and of second start layer 25, an electrical potential can be applied to third electrode device 6 via opening 62', through first dielectric layer 17. Third electrode device 6 is electrically connected, via regions of first functional layer 19 and via spring device 14, to actuator device 15, in particular to first electrode device 10.

In a further method step, internal surface 55 of wafer 50 is exposed to form mirror structures 8, for example through grinding and etching of first segment 58 of wafer 50. In a further method step, oxide layers 17, 23 in component 100' on actuator device 15 are removed.

Preferably, this can take place using an HF gas phase etching step. With this method step, at the same time sacrificial oxide 54 on the surface of mirror structure 8 can also be removed. A highly reflective mirror metallization, for the formation of reflective surface 9, can be deposited on the surface, now clean and smooth, of mirror structure 8.

Figure 11:
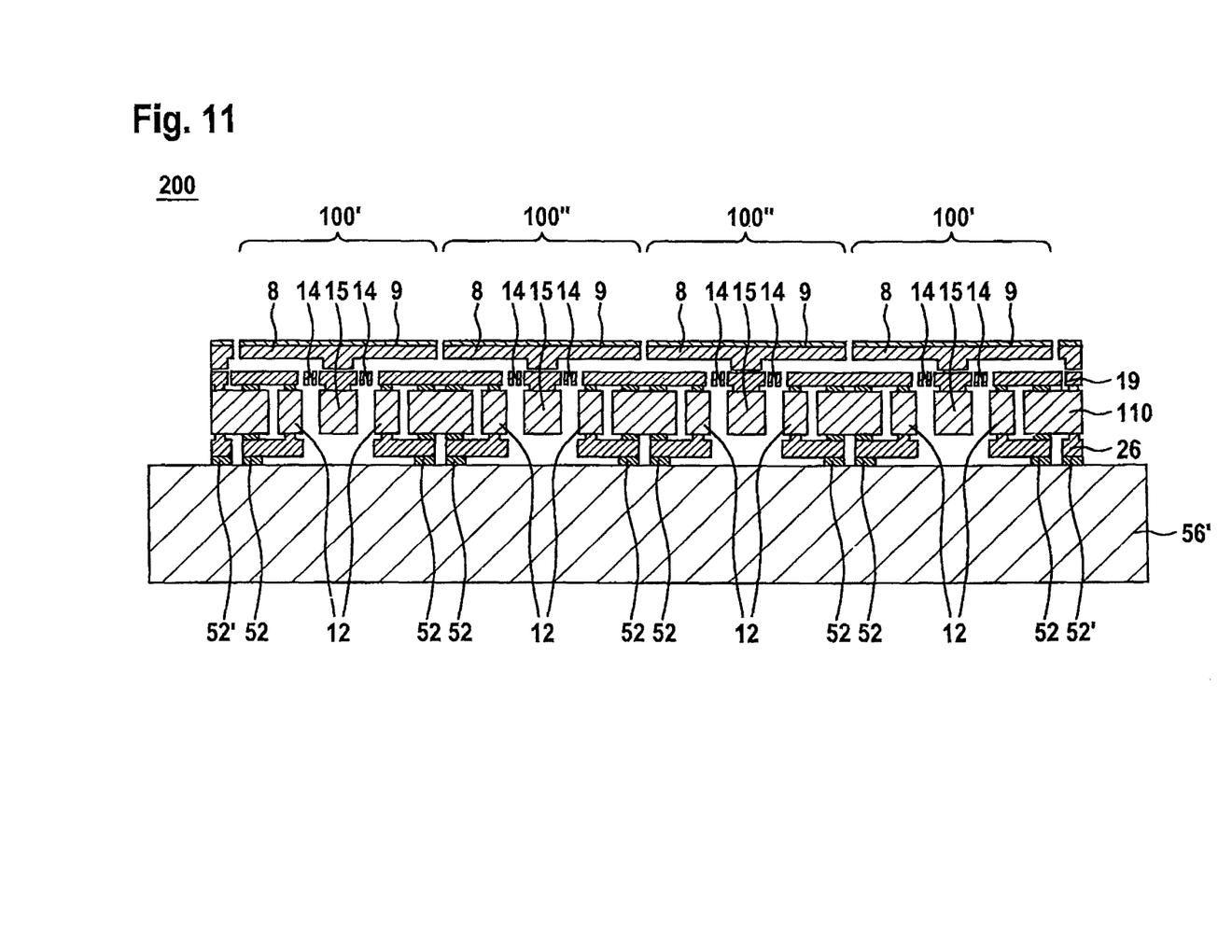
FIG. 11 shows a cross-section-type upright side view of a system 200 according to a third exemplary embodiment of the present invention, having two components 100" according to a fourth specific embodiment of the present invention, as well as two components 100' according to the second specific embodiment of the present invention.

FIG. 11 shows a schematic upright cross-section-type side view of a system 200 according to a second specific embodiment of the present invention, having two components 100" according to a third specific embodiment of the present invention, as well as two components 100' according to the first specific embodiment of the present invention.

In FIG. 11 as well, for better comprehension spring devices 14 are depicted even though they cannot be seen in the cross-sectional plane shown in the rest of FIG. 11. Components 100" according to the third specific embodiment differ from components 100' according to the first specific embodiment of the present invention in that they do not have a third electrode device 6, or in that third electrode device 6 is situated differently.

According to FIG. 11, system 200, or components 100', are bonded onto a bearer substrate 56' via contact surfaces 52, 52'. In the following, the individual components 100" can be sawed apart from one another, but system 200 can also be installed as a whole.

Figure 12A:
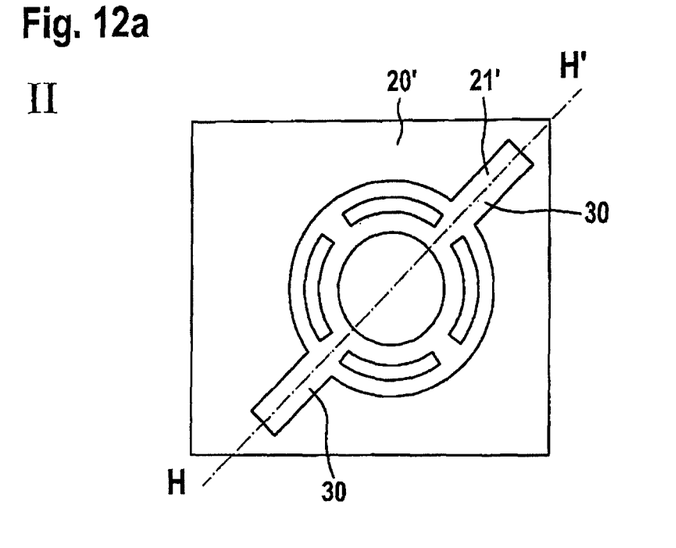
FIG. 12a shows a schematic plan view from above of a component being produced, according to a fifth specific embodiment.

FIG. 12a shows a schematic plan view from below of a component being produced according to a fourth specific embodiment.

Figure 12B:
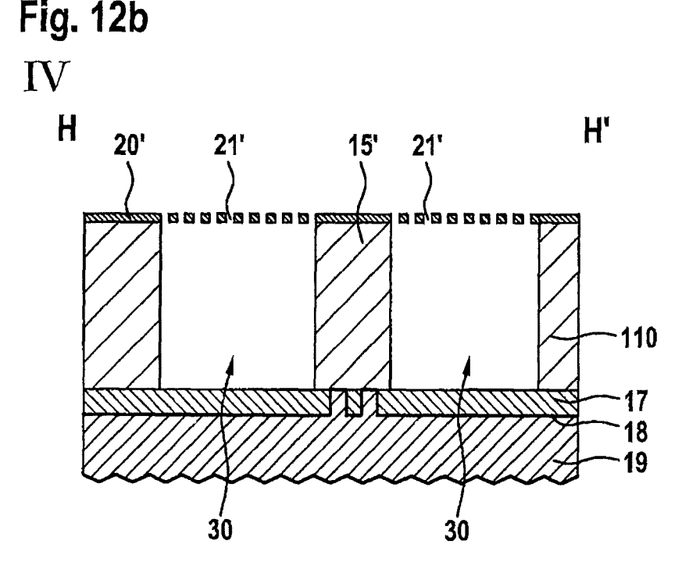

FIG. 12b shows a schematic reversed cross-section-type side view through the component being produced, according to the fourth specific embodiment, along the line H-H' in FIG. 12a.

According to FIGS. 12a and 12b, during etching of chambers 22 of substrate 110 (see FIGS. 4a and 4b), not only electrode devices 6, 10', 12 of actuator device 15' are exposed. Additional regions 30 outside electrode devices 6, 10' 12 can also be etched free in the substrate, over which a spring device 31 can be situated. In this way, it is possible also to produce a very long spring element 31 having a high degree of freedom of movement, extending broadly over actuator device 15'. In this way, for example torsion springs can be produced.

Although the present invention has been described on the basis of preferred exemplary embodiments, it is in no way limited thereto, but rather can be modified in many ways.

For example, one or both of the functional layers 19, 26 can also be deposited, instead of as a polysilicon layer, as a metallic layer, in particular as a copper layer or as an aluminum layer, in particular having a thickness in a range of from 1 to 5 μm or more. The planarization of the first and/or second functional layer 19, 26, fashioned as an epi-poly layer, as well as the fashioning of the respective first and/or second start layer 18, 25, can correspondingly be omitted.

Given a suitable selection of metal, the formation of contact surfaces 52, 52' can also be omitted. Instead, the corresponding second functional layer 26, fashioned as a metallic layer, can be structured in such a way that in each case regions 28 and contact surfaces 52, or regions 28' and contact surfaces 52', are replaced by corresponding regions of second functional layer 26 fashioned as a metallic layer.

The method steps do not have to be executed in the sequence in which they occur in the present description. In particular, the thinning of substrate 110 from its underside U, the formation and structuring of dielectric auxiliary layer 20, the formation of chambers 22 for the exposure of electrode devices 6, 10', 12, the formation of second dielectric layer 23, and the formation and structuring of second functional layer 26 can take place in this sequence as a first block of method steps. This block of method steps can in particular take place after a second block of method steps that includes the provision of substrate 110, the formation and structuring of first dielectric layer 17, the formation and planarization of first functional layer 19, the application of mirror metallization 9 and/or the application and structuring of connecting layer 27, the structuring of first functional layer 19 using the trench process, and the bonding on of structured wafer 50, in this sequence.

Through this sequence of execution, substrate 110, before being thinned, is reinforced by structured wafer 50 and is thus stabilized for subsequent processes. This can be advantageous if the finished component is intended to have a thickness in a range of from 350 µm to 450 µm or less. Here, it can in addition be advantageous to fashion second functional layer 26, for example as described above, as a metallic layer that can be produced at lower temperatures.

What is claimed is:

1. A micro-electromechanical component, comprising:
an electrically conductive substrate having an upper side and an underside;
a structured electrically conductive first functional layer provided on the upper side of the substrate;
an elastically deflectable actuator device suspended via a spring device configured in the first functional layer;
a movable first electrode device which extends vertically through the substrate and is connected to the actuator device; and
a stationary second electrode device which extends vertically through the substrate, at a distance from the first electrode device;
wherein the actuator device is configured to be selectively deflected by an application of an electrical voltage between the first and second electrode devices.

2. The device as recited in claim 1, further comprising:
a structured electrically conductive second functional layer configured on the underside of the substrate;
wherein contact surfaces are configured on the second functional layer, via which an electrical voltage is applied between the first and second electrode devices.

3. The device as recited in claim 2, wherein the second functional layer is at least one of mechanically and electrically connected to a bearer substrate via the contact surfaces.

4. The device as recited in claim 2, wherein an electrical potential is selectively applied to the first electrode device via the spring device.

5. The device as recited in claim 2, wherein an electrical potential is selectively applied to the first electrode device via the first functional layer, from the underside of the substrate, via a third electrode device which extends vertically through the substrate.

6. The device as recited in claim 2, wherein the movable first electrode device is configured as one of a cylinder or a hollow cylinder.

7. The device as recited in claim 6, wherein the stationary second electrode device includes at least four individual electrodes situated at a distance from one another in polygonal symmetry around the first electrode device.

8. The device as recited in claim 2, wherein the actuator device is connected to a mirror element which has a reflective surface oriented away from the upper side of the substrate.

9. The device as recited in claim 8, wherein the mirror element is connected to the actuator device via a spacer device.

10. A system of micro-electromechanical components, comprising:
multiple micro-electromechanical components at least one of mechanically and electrically connected by bonding to a common bearer substrate, wherein each micro-electromechanical component includes:
an electrically conductive substrate having an upper side and an underside;
a structured electrically conductive first functional layer provided on the upper side of the substrate;
an elastically deflectable actuator device suspended via a spring device configured in the first functional layer;
a movable first electrode device which extends vertically through the substrate and is connected to the actuator device; and
a stationary second electrode device which extends vertically through the substrate, at a distance from the first electrode device;
wherein the actuator device is configured to be selectively deflected by an application of an electrical voltage between the first and second electrode devices.

11. A method for producing a micro-electromechanical component, comprising:
providing an electrically conductive substrate having an upper side and an underside;
forming an electrically conductive first functional layer on the upper side of the substrate;
structuring the fashioned first functional layer in such a way the first functional layer has a spring device and an elastically deflectable actuator device suspended via the spring device; and
etching the substrate, going out from the underside of the substrate, to configure, at a distance from one another, (i) a movable first electrode device extending vertically through the substrate, connected to the actuator device, and (ii) a stationary second electrode device extending vertically through the substrate, whereby the actuator device is configured to be selectively deflected by an application of an electrical voltage between the first and second electrode devices.

12. The method as recited in claim 11, further comprising:
depositing and structuring a first dielectric layer on the underside of the substrate;
wherein the etching of the substrate takes place through at least one of (i) a grid configured in the structured first dielectric layer and (ii) regions opened in the structured first dielectric layer.

13. The method as recited in claim 11, further comprising:
depositing a first start layer of polysilicon on the upper side of the substrate, using a low-pressure gas phase deposition method;

wherein the forming of the first functional layer takes place using an epitaxial deposition on the first start layer.

14. The method as recited in claim 11, further comprising:

bonding a structured silicon-on-insulator wafer onto the first functional layer via germanium contact surfaces fashioned on the structured wafer;

exposing an internal surface of the bonded-on structured wafer; and depositing a reflective mirror layer on the exposed surface of the bonded-on structured wafer to form a mirror element.

\* \* \* \* \*